United States Patent
Forrest et al.

(10) Patent No.: US 6,650,045 B1
(45) Date of Patent: *Nov. 18, 2003

(54) DISPLAYS HAVING MESA PIXEL CONFIGURATION

(75) Inventors: Stephen R. Forrest, Princeton, NJ (US); Paul Burrows, Princeton, NJ (US); Dmitri Z. Garbuzov, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/576,790

(22) Filed: May 23, 2000

Related U.S. Application Data

(62) Division of application No. 08/794,595, filed on Feb. 3, 1997, now Pat. No. 6,091,195.

(51) Int. Cl.[7] .................................................. H01J 1/62
(52) U.S. Cl. ........................ 313/504; 345/83; 345/84; 345/60; 345/65; 345/82; 313/503; 313/506; 313/509; 430/201; 430/200; 430/319; 315/169.3; 315/169.4; 385/123; 385/131; 385/147
(58) Field of Search .............................. 345/82, 83, 84, 345/60, 65; 313/504, 506, 509, 503; 445/23, 24, 11, 9, 10; 430/201, 200, 319; 315/169.3, 169.4; 385/147, 123, 131

(56) References Cited

U.S. PATENT DOCUMENTS

| | | | |
|---|---|---|---|
| 4,769,292 A | | 9/1988 | Tang et al. |
| 5,133,036 A | * | 7/1992 | Tornqvist .................... 385/130 |
| 5,294,870 A | | 3/1994 | Tang et al. |
| 5,445,711 A | * | 8/1995 | Tanski et al. ................ 216/13 |

(List continued on next page.)

FOREIGN PATENT DOCUMENTS

| | | |
|---|---|---|
| JP | 06-274645 | 11/1994 |
| WO | 96/19792 | 6/1996 |

OTHER PUBLICATIONS

S. W. Depp and W. E. Howard, "Flat Panel Displays," *Scientific American* 90 (Mar. 1993).

D. Z. Garbuzov et al., "Photoluminescence Efficiency and Absorption of Aluminum Tri–Quinolate ($Alq_3$) Thin Films," 249 *Chemical Physics Letters* 433 (1996).

C. E. Johnson et al., "Luminescent Iridium (I), Rhodium (I), and Platinum (II) Dithiolate Complexes," 105 *Journal of the American Chemical Society* 1795 (1983).

Hosokawa et al., "Highly efficient blue electroluminescence from a distrrylarylene emitting layer with a new dopant," 67 *Appl. Phys. Lett.* 3853–3855 (Dec. 1995).

Adachi et al., "Blue light–emitting organic electroluminescent devices," 56 *Appl. Phys. Lett.* 799–801 (Feb. 1990).

C. C. Wu et al., "Integrated three–color organic light–emitting devices," 69 *Appl. Phys. Lett.* 3117–3119 (Nov. 1996).

H. Vestweber et al., "Electroluminescense from polymer blends and molecularly doped polymers," 64 *Synthetic Metals* 141–145 (1994).

Burrows et al., "Color Tunable Organic Light Emitting Devices," 69 *Appl. Phys. Lett.* 2959 (Nov. 11, 1996).

(List continued on next page.)

*Primary Examiner*—Richard Hjerpe
*Assistant Examiner*—Abbas Abdulselam
(74) *Attorney, Agent, or Firm*—Kenyon & Kenyon

(57) ABSTRACT

A multicolor organic light emitting display device employs angle-walled blue, green and red emitting mesas, with optional metal reflectors on the angled walls, in a plurality of pixels. The angle-walled mesas, which resemble truncated pyramids, direct light out of the mesa by reflection from the mesa side walls or by mirror reflection. The device of the present invention reduces waveguiding, thus simultaneously increasing both display brightness and resolution.

33 Claims, 11 Drawing Sheets

U.S. PATENT DOCUMENTS

| | | | |
|---|---|---|---|
| 5,496,597 A | * | 3/1996 | Soininen et al. ............ 427/584 |
| 5,521,465 A | * | 5/1996 | Budzilek .................... 313/503 |
| 5,663,573 A | | 9/1997 | Epstein et al. |
| 5,674,597 A | | 10/1997 | Fuji et al. |
| 5,703,436 A | | 12/1997 | Forrest et al. |
| 5,707,745 A | | 1/1998 | Forrest et al. |
| 5,721,160 A | | 2/1998 | Forrest et al. |
| 5,757,026 A | | 5/1998 | Forrest et al. |
| 5,757,139 A | | 5/1998 | Forrest et al. |
| 5,811,833 A | | 9/1998 | Thompson |
| 5,834,893 A | | 11/1998 | Bulovic et al. |
| 5,844,363 A | | 12/1998 | Gu et al. |
| 5,917,280 A | | 6/1999 | Burrows et al. |
| 5,986,268 A | | 11/1999 | Forrest et al. |
| 6,013,982 A | | 1/2000 | Thompson et al. |
| 6,045,930 A | | 4/2000 | Thompson et al. |
| 6,046,543 A | | 4/2000 | Bulovic et al. |
| 6,048,630 A | | 4/2000 | Burrows et al. |
| 6,091,195 A | * | 7/2000 | Forrest et al. .............. 313/504 |
| 6,225,029 B1 | * | 5/2001 | Bongaerts ................... 430/313 |

OTHER PUBLICATIONS

D. Z. Garbuzov et al., "Organic films deposited on Si p–n junctions: Accurate measurements of fluorescence internal efficiency, and application to luminescent antireflection coatings," 80 *J. Appl. Phys.* 4644–4648 (Oct. 1996).

P.E. Burrows et al., "Reliability and degradation of organic light emitting devices," 65 *Appl. Phys. Lett.* 2922–2924 (Dec. 1994).

H. A. MacLeod, *Thin Film Optical Filters*, pp. 94–110 (1969).

Johnson et al., "Electroluminescence from Single Layer Molecularly doped polymer films," 67 *Pure & Appl. Chem.*, 175–182 (1985).

* cited by examiner

DISPLAYS HAVING MESA PIXEL CONFIGURATION

CROSS-REFERENCE TO RELATED APPLICATIONS

This application is a divisional of U.S. Ser. No. 08/794,595, filed Feb. 3, 1997 now U.S. Pat. No. 6,091,193.

GOVERNMENT RIGHTS

This invention was made with Government support under Contract No. F33615-94-1-1414 awarded by DARPA. The government has certain rights in this invention.

FIELD OF THE INVENTION

This invention relates to display devices which use organic light emitting devices (OLED's), and more particularly to display devices which are designed to minimize the problem of waveguiding.

BACKGROUND OF THE INVENTION

The electronic display is used in such devices as television sets, computer terminals, telecommunications equipment and a host of other applications as well. No other communication medium offers its speed, versatility and interactivity. Among the types of electronic displays currently available, there is no doubt that the technology concerning flat panel displays is of a significant interest and progress is continuously being made in this field. For example, according to S. W. Depp and W. E. Howard, ("Flat Panel Displays", *Scientific American* 90–97 (March 1993)), incorporated herein by reference, flat panel displays were expected to form a market of between 4 and 5 billion dollars in 1995 alone. Desirable factors for any display technology include the ability to provide a high resolution, full color display at good light level and at competitive pricing.

Organic light emitting devices (OLED's), which make use of thin film materials which emit light when excited by electric current, are becoming an increasingly popular form of flat panel display technology. Presently, the most favored organic emissive structure is referred to as the double heterostructure (DH) OLED, shown in FIG. 1A. In this device, a substrate layer of glass 10 is coated by a thin layer of indium-tin-oxide (ITO) 11. Next, a thin (100–500 Å) organic hole transporting layer (HTL) 12 is deposited on ITO layer 11. Deposited on the surface of HTL 12 is a thin (typically, 50 Å–500 Å) emission layer (EL) 13. The EL 13 provides the recombination site for electrons injected from a 100–500 Å thick electron transporting layer 14 (ETL) with holes from the HTL 12. Examples of prior art ETL, EL and HTL materials are disclosed in U.S. Pat. No. 5,294,870, the disclosure of which is incorporated herein by reference.

Often, the EL 13 is doped with a highly fluorescent dye to tune color and increase the electroluminescent efficiency of the OLED. The device as shown in FIG. 1A is completed by depositing metal contacts 15, 16 and top electrode 17. Contacts 15 and 16 are typically fabricated from indium or Ti/Pt/Au. Electrode 17 is often a dual layer structure consisting of an alloy such as Mg/Ag 17' directly contacting the organic ETL 14, and a thick, high work function metal layer 17" such as gold (Au) or silver (Ag) on the Mg/Ag. The thick metal 17" is opaque. When proper bias voltage is applied between top electrode 17 and contacts 15 and 16, light emission occurs from emissive layer 13 through the glass substrate 10. An LED device of FIG. 1A typically has luminescent external quantum efficiencies of from 0.05% to 2% depending on the color of emission and the device structure.

Another known organic emissive structure is referred to as a single heterostructure (SH) OLED, as shown in FIG. 1B. The difference between this structure and the DH structure is that multifunctional layer 13' serves as both EL and ETL. One limitation of the device of FIG. 1B is that the multifunctional layer 13' must have good electron transport capability. Otherwise, separate EL and ETL layers should be included as shown for the device of FIG. 1A.

Yet another known LED device is shown in FIG. 1C, illustrating a typical cross sectional view of a single layer (polymer) OLED. As shown, the device includes a glass substrate 1 coated by a thin ITO layer 3. A thin organic layer 5 of spin-coated polymer, for example, is formed over ITO layer 3, and provides all of the functions of the HTL, ETL, and EL layers of the previously described devices. A metal electrode layer 6 is formed over organic layer 5. The metal is typically Mg, Ca, or other conventionally used low work function metal.

An example of a multicolor electroluminescent image display device employing organic compounds for light emitting pixels is disclosed in U.S. Pat. No. 5,294,870. This patent discloses a plurality of light emitting pixels which contain an organic medium for emitting blue light. Fluorescent media are positioned between the blue OLED and the substrate in certain parts of the pixels. The fluorescent media absorb light emitted by the blue OLED and emit red and green light in different regions of the same pixel. One drawback of this display is that waveguiding of light through the glass substrate from one pixel to adjacent pixels of different color can result in blurring, color bleeding, lack of image resolution and the loss of waveguided light. This problem is schematically shown in FIG. 1D for a device shown in FIG. 1A, and is further described in D. Z. Garbuzov et al., "Photoluminescence Efficiency and Absorption of Aluminum Tri-Quinolate ($Alq_3$) Thin Films," 249 *Chemical Physics Letters* 433 (1996), incorporated herein by reference. A further problem in this device is that the ITO used as a transparent, conductive layer is a high-loss material, thus resulting in absorption of waveguided light by ITO layers. One additional problem encountered in this and other prior art devices is that the LED interconnect lines can be seen by the viewer as black lines surrounding individual pixels, thus increasing the granularity of the display and limiting resolution.

SUMMARY OF THE INVENTION

It is an object of the present invention to provide a monochromatic or multicolor organic light emitting device with improved efficiency.

It is a further object of the present invention to provide a display device that is characterized by reduced or negligible waveguiding.

It is an additional object of the present invention to provide a display device wherein the LED interconnect lines are not visible to an observer of the display.

It is a further object of this invention to provide a high-definition display device in which the LED's are arranged in distinct, reflective angle-walled mesas, wherein each mesa appears as a truncated pyramid, so to substantially prevent the waveguiding of light from one pixel to another, thereby increasing display brightness and efficiency.

It is another object of the present invention to provide an organic light emitting device which is extremely reliable, relatively inexpensive to produce, compact, efficient and requires low drive voltages.

The present invention comprises monochromatic and multicolor display devices comprising a plurality of pixels, each of said plurality of pixels comprising a substrate and at least one angle-walled mesa connected to said substrate. The mesas used in the present invention appear as truncated pyramids, each having a top portion which is narrow relative to its bottom portion such that light is directed via reflection in a direction from its top portion to its bottom portion.

In a first embodiment of the present invention, each pixel comprises light-emitting devices arranged in three mesas on a transparent substrate, wherein the first of said mesas serves as a blue light emitter, the second of said three mesas serves as a green light emitter and the third of said three mesas serves as a red light emitter. In this embodiment, the bottom portion of each mesa is immediately adjacent the substrate such that the light emitted by each mesa is directed towards the substrate.

In a second embodiment of the invention, each pixel comprises light-emitting devices arranged in three inverted angle-walled mesas wherein the first of said three inverted mesas serves as a blue light emitter, the second of said three inverted mesas serves as a green light emitter and the third of said three inverted mesas serves as a red light emitter. In this embodiment, the mesas are referred to as being "inverted" because the top portion of each mesa is immediately adjacent the substrate such that the light emitted by each mesa is directed away from the substrate.

In a third embodiment of the present invention, each pixel comprises light-emitting devices arranged in a single mesa or inverted mesa which serves as an emitter of blue, green or red light, alone or in combination, by virtue of a stacked structure of blue, green and blue OLED's.

To prevent waveguiding and resulting color cross-talk, each mesa of all embodiments of the present invention is separated one from the other and is at least partially surrounded by reflective materials. The present invention also includes methods for making each display device embodiment.

DETAILED DESCRIPTION

Organic thin film phosphors can convert violet-blue radiation into green and red with efficiencies close to 100% at room temperature. The absorption coefficient for these phosphors at energies higher than their optical bandgap exceeds 2 to $3 \times 10^4$ cm$^{-1}$ such that films with thickness of 1 $\mu$m are sufficient for full absorption and down-conversion of short wavelength radiation. These phosphor films in combination with short wavelength (blue or violet OLED's) are used in the fabrication of the color displays of the present invention.

One example of a three color display with green and red down converter luminescent layers is described in U.S. Pat. No. 5,294,870. As an improvement, the present invention solves the problems of refractive index-matching and waveguiding effects in the plane of the structure. The present invention achieves such results by careful index matching of LED layers and by configuring LED's in a truncated pyramidal mesa structure. Waveguiding effects within each LED of the present invention are therefore insignificant because OLED and/or phosphor layers are laterally bound by angle-walled mesas. This results in improved radiation coupling out of the device with resulting increased total display brightness.

Figure 2A:
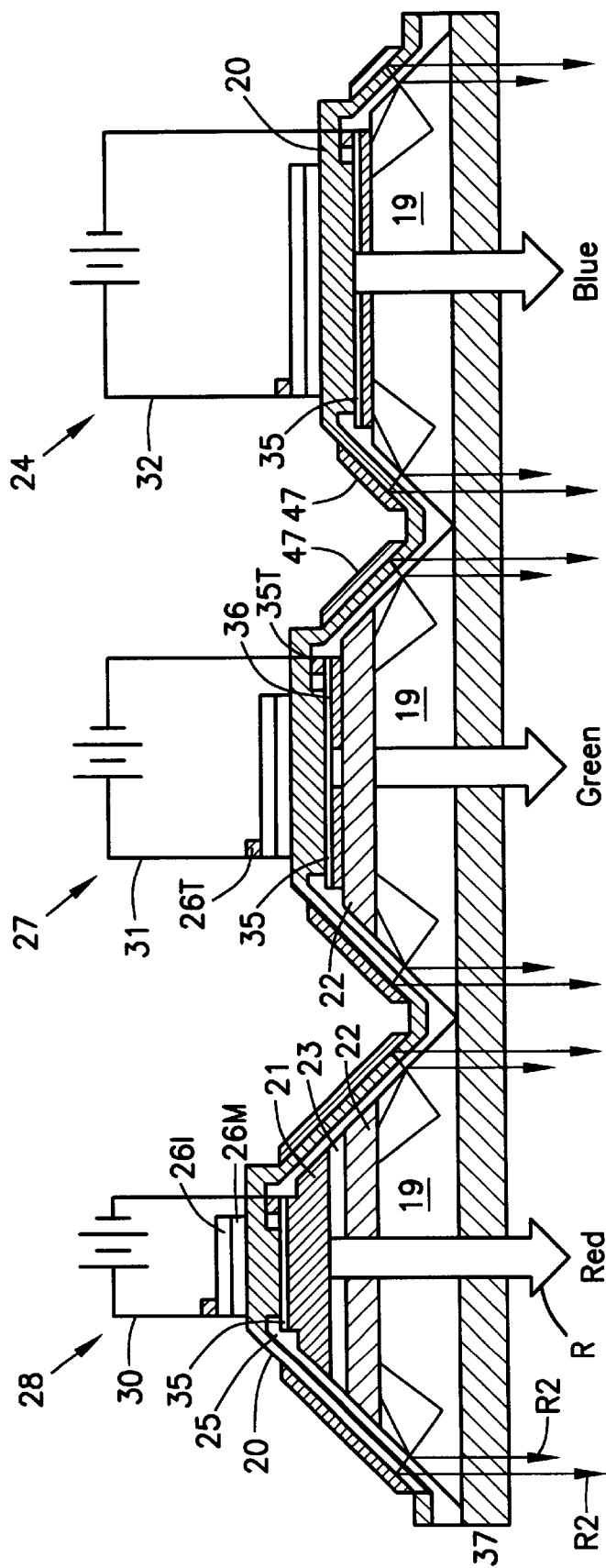
FIGS. 2A, 2B and 2C are cross sectional views of integrated three color pixels utilizing blue organic light emitting devices (OLED's) and red and green down conversion phosphors according to embodiments of this invention.

The first embodiment of the present invention can be seen in FIG. 2A, which shows a schematic cross section of a highly compact, integrated RGB pixel structure which is implemented by grown or vacuum deposited organic layers. In this embodiment, waveguiding is reduced and radiation output is increased due to the collimating effect of the mesa structure. This collimation is achieved either by total reflection from the angled walls of the mesa structure or by mirror reflection from metal deposited on the angled walls.

It should be noted that the device shown in FIG. 2A is not intended to be drawn to scale. This embodiment includes pixels having three mesa stacks on a common substrate 37, the stacks comprising a blue OLED layer 20 and red and/or green down conversion phosphors, designated as 21 and 22, respectively, depending on the particular stack. Substrate 37 is generally fabricated from a transparent material, such as glass, quartz, sapphire or plastic. The OLED layer can be of either DH or SH configuration, or a single layer of polymer-based OLED, as is well-known in the art.

Device 24 is a blue emitter that includes a blue OLED 20 that extends horizontally to also form a top portion of each of devices 27 and 28, as shown. Device 27 is a green emitter that includes the blue OLED 20 and a green down conversion phosphor 22 in a bottom portion of the stack, with the phosphor 22 down converting the blue light from OLED 20 to green light. The third device 28 contains a red down conversion phosphor 21 disposed between the blue OLED 20 and the green down conversion phosphor 22 that converts the blue light from OLED 20 to red light. In this case, the red light passes unabsorbed through green phosphor 22, which is transparent to red light. The green down conversion phosphor 22 is left in device 28 for ease of fabrication. Alternatively, the third device 28 includes the blue OLED 20 and a red down conversion phosphor 21 in a bottom portion of the stack, with the red phosphor down converting the blue light from OLED 20 to red light without passing through a green down conversion phosphor layer. In yet another alternative arrangement of the third device 28, a layer of green down conversion phosphor is positioned between blue OLED 20 and red down conversion phosphor 21. In this arrangement, the green down conversion phosphor 22 will convert the blue light emitted from OLED 20 to green light, and then red down conversion phosphor 21 converts this green light to red light. This arrangement, however, is not generally preferred because device efficiency tends to decrease with an increased number of down conversion steps.

The mesa walls of any of devices 24, 27 and 28 can be configured at any acute angle so as to minimize or prevent waveguiding, although 35°–45° relative to the substrate is preferred. The collimating dielectric layer 19 making up the bottom-most portion of devices 24, 27 and 28 is angled so that the light that would normally be waveguided into lateral pixels, and contribute to color bleeding and loss of resolution and brightness, is instead directed out of the substrate 37 by reflection off of the mesa side walls and reflectors 47. This reflection is shown as beams $R_2$ which emerge from the dielectric layer 19 through the substrate 37 and act to augment beam R.

Figure 3:
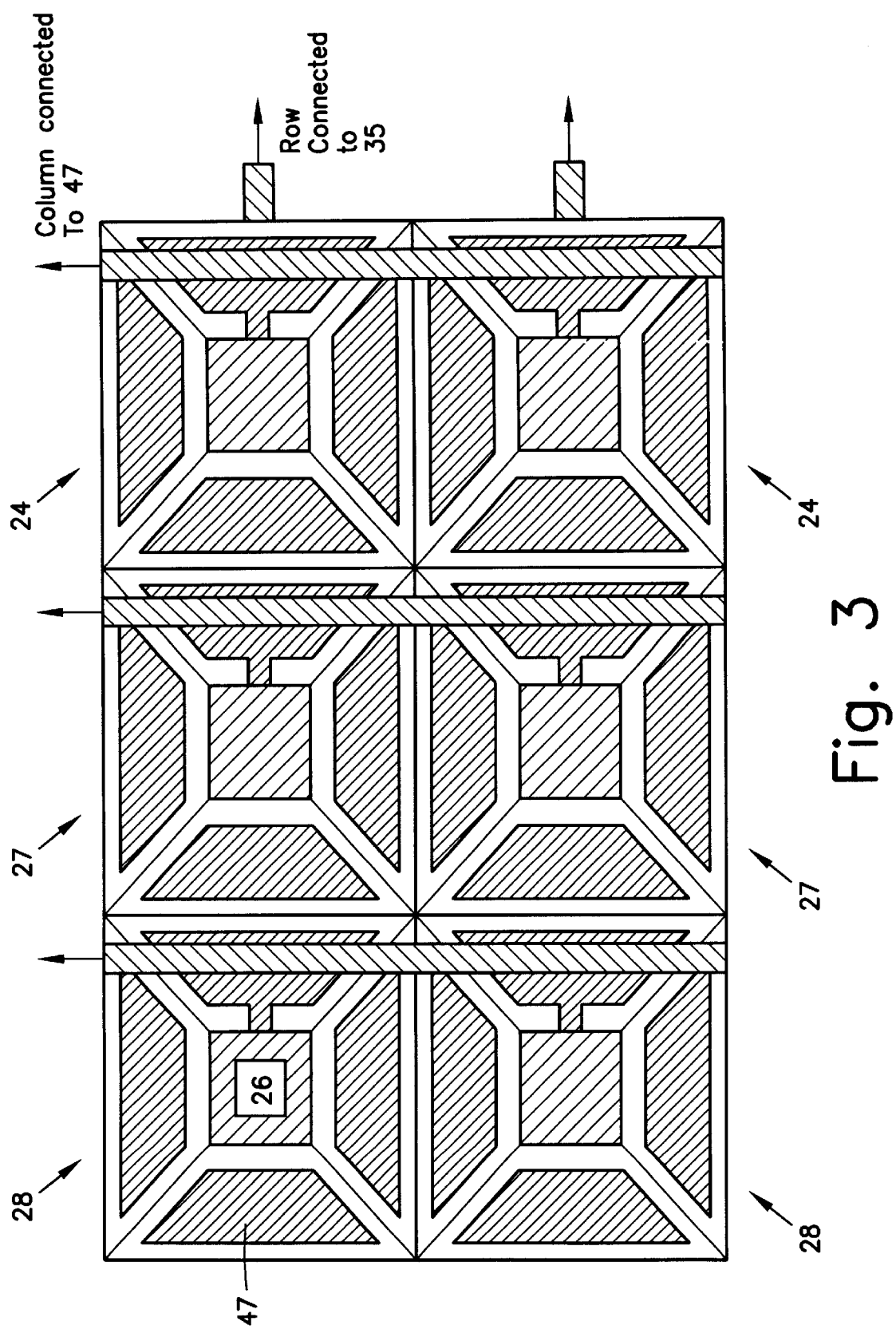
FIG. 3 shows a top view of one embodiment of the present invention.

Reflectors 47 may be made of aluminum, silver, Mg/Al and the like. In addition to serving as reflectors, reflectors 47 can be used as interconnects by extending reflectors 47 to connect with metal layers 26 as shown in FIG. 3. One distinct advantage to using reflectors 47 as interconnects is that such interconnects are positioned between adjoining mesas such that they are hidden from the viewer. The resulting display therefore has none of the dark lines between adjoining pixels as are frequently found in conventional display devices.

For simplicity, the OLED device used in the present invention is shown as a single layer in the drawings. As is well-known in the art, however, the layer actually comprises multiple sub-layers if the OLED is not a single-layer polymer, the arrangement of which sub-layers depends on whether the device is DH or SH configuration.

If, for example, a DH OLED is used in the present invention, OLED device 20 will consist of an HTL vacuum-deposited or grown on or otherwise deposited onto the surface of an ITO layer. A top ETL sandwiches an EL between the former and the HTL. Each of the HTL, ETL, ITO and organic EL layers are transparent because of their composition and minimal thickness. Each HTL may be 50–1000 Å thick; each EL may be 50–500 Å thick; each ETL may be 50–1000 Å thick; and the ITO layer may be 1000–4000 Å thick. For optimum performance and low voltage operation, each of the organic layers should preferably be kept towards the lower ends of the above ranges. Each device 24, 27 and 28 (excluding ITO/metal layers) is preferably close to 500 Å thick. Examples of suitable organic ETL, EL and HTL materials can be found in U.S. Pat. No. 5,294,870.

Formed on top of ETL is a low work function (preferably, <4 eV) metal layer 26M. Suitable candidates for metal layer 26M include Mg, Mg/Ag, and Li/Al. Deposited on the top of metal layer 26M is another conductive layer 26I suitable for forming an electrical contact. Conductive layer 26I can be made of ITO, Al, Ag or Au, for example. For convenience, the double layer structure of metallic layers 26M and 26I is referred to as metal layer 26. Terminal 26T is formed on metal layer 26 for electrical connection thereto, and may be made from In, Pt, Au, Ag, and combinations thereof, or any suitable material as is known in the art.

Figure 1A:
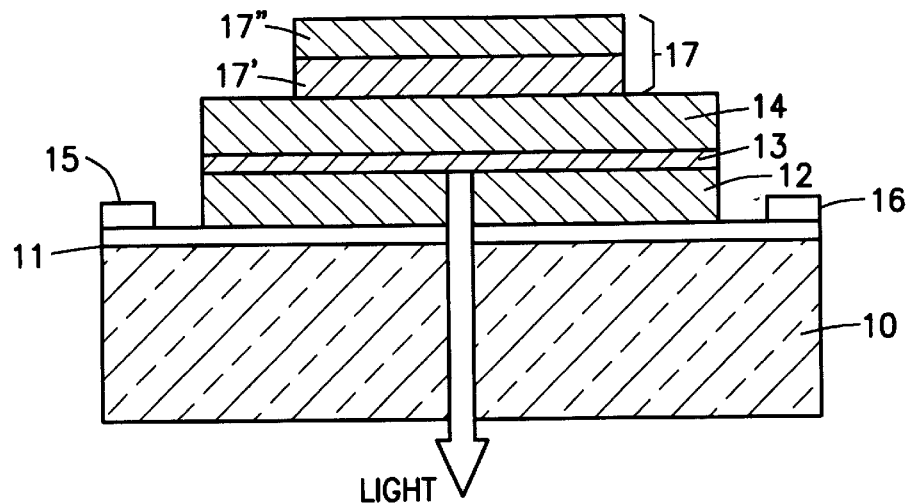
FIG. 1A is a cross sectional view of a typical organic double heterostructure light emitting device (OLED) according to the prior art.
Figure 1B:
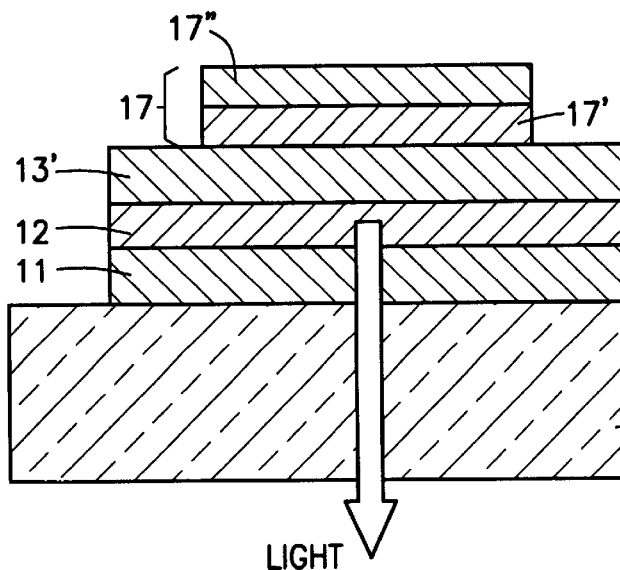
FIG. 1B is a cross sectional view of a typical organic single heterostructure light emitting device (LED) according to the prior art.
Figure 1C:
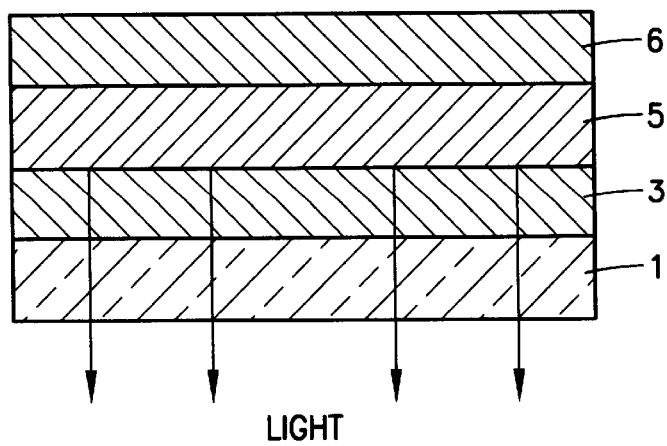
FIG. 1C is a cross sectional view of a known single layer polymer LED structure according to the prior art.
Figure 1D:
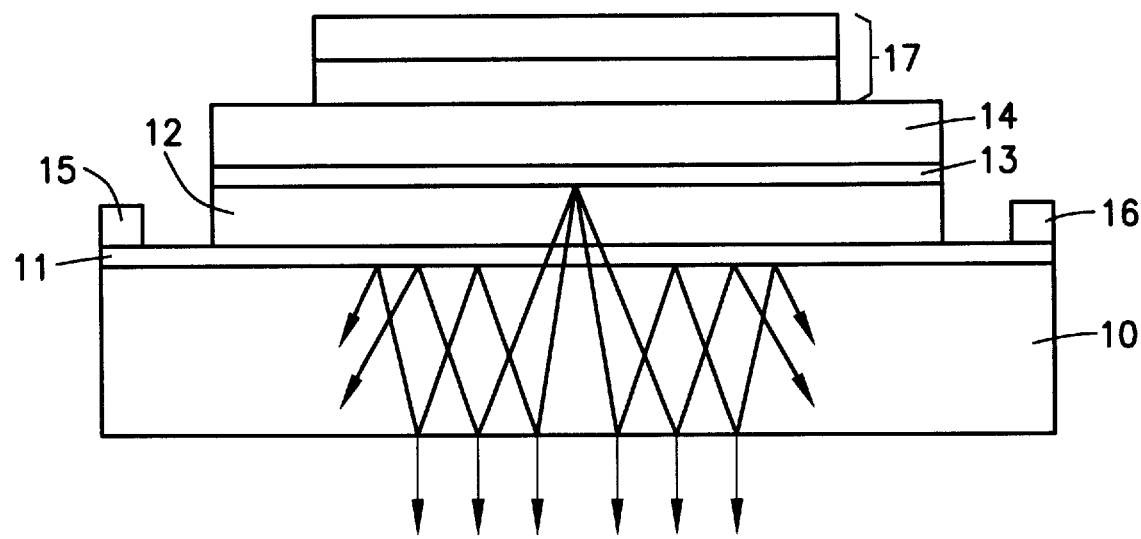
FIG. 1D illustrates the problem of waveguiding in conventional structures LED structures.

If a SH OLED structure is used for providing devices 24, 27 and 28, rather than DH OLED devices, the ETL and EL layers are provided by a single multifunctional layer, such as layer 13', as previously described for the SH of FIG. 1B. This layer 13' is Al-quinolate or other known materials, which can accomplish the multifunctional purpose of layer 13'. However, an advantage of DH OLED stacks over SH OLED stacks is that DH OLED stacks generally permit higher efficiencies.

Each device 24, 27 and 28 emits light through glass substrate 37 in a substantially omnidirectional pattern. The voltages across the OLED's in each of devices 24, 27 and 28 are controlled to provide a desired resultant emission color and brightness for the particular pixel at any instant of time. Obviously, device 24 emits blue light, device 27 emits green light and device 28 emits red light. Moreover, different combinations of devices 24, 27 and 28 can be activated to selectively obtain a desired color of light for the respective pixel partly dependent upon the magnitude of current in each of the devices 24, 27 and 28.

Devices 24, 27 and 28 can be forward biased by batteries 32, 31 and 30, respectively. In FIG. 2A, current flows from the positive terminal of each battery 32, 31 and 30, into the cathode terminal 26T of its associated device, through the layers of each respective device, and from anode terminals 35T formed on conductive layers 35 to negative terminals of each battery 32, 31, and 30. As a result, light is emitted from the OLED layer in each of the devices 24, 27 and 28. Isolation layer 25 prevents the cathode and anode layers from shorting. When the pixels are aggregated into a display, anode and cathode terminals are brought out at an edge of the display, for example.

Each device 24, 27 and 28 can optionally comprise a layer 36 of low-loss, high refractive index dielectric material, such as $TiO_2$, between contact 35 and layer 21, 22 and 19, respectively. Layer 36 is especially preferred when contact 35 is made from ITO, which is a high-loss material such that light from blue OLED layer 20 can be easily waveguided in and absorbed by contact 35. The refractive indexes for $TiO_2$ and ITO are approximately 2.6 and 2.2, respectively. Layer 36 therefore substantially eliminates waveguiding and absorption in the ITO, the light emitted from blue OLED layer 20 now being either transmitted through layer 36 or waveguided within layer 36 and reflected by the mesa side walls and reflectors 47.

Figure 2B:
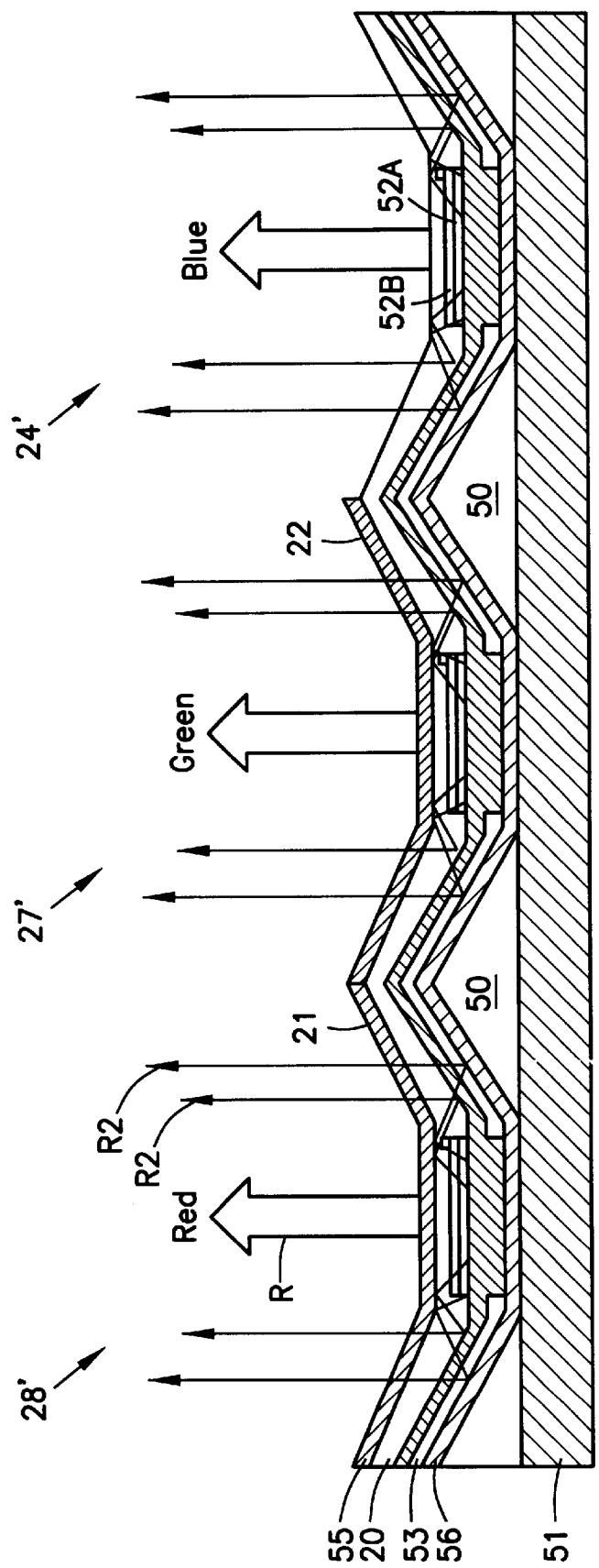

In the second embodiment of the present invention, the device of FIG. 2A is constructed in an opposite or inverted manner, for providing light emission out of the top of the stack rather than the bottom. In accordance with this second embodiment, as shown in FIG. 2B (not drawn to scale), the collimating action of the "inverted" angle-walled mesa structure suppresses waveguiding along the structure layers. In this embodiment, the mesas are referred to as being "inverted" because the top portion of each mesa is immediately adjacent the substrate such that the light emitted by each mesa is directed away from the substrate. Without the inverted mesa structure of FIG. 2B, waveguiding along the structure layers could lead to inadvertent optical pumping of down converting layers in one pixel by light emitted from a nearby pixel, a phenomenon known as "cross-talk" or color bleeding.

In the embodiment shown in FIG. 2B, a layer of dielectric material such as SiOx, SiNx, polyimide, etc. is deposited on substrate 51 and etched to form regions 50, between which are left flat-bottom pits. Regions 50 allow for the formation of the inverted mesa configuration of devices 24', 27' and 28' by the deposition of the layers comprising these devices.

Each of the inverted mesas of devices 24', 27' and 28' include reflective metal contact layer 56, isolation layer 53, blue OLED layer 20, dielectric layer 55, and red or green phosphors 21 and 22 for inverted mesas devices 28' and 27', respectively. Inverted mesa device 28' can alternatively have a layer of green phosphor positioned either i) between blue OLED layer 20 and red phosphor 21, or ii) over red phosphor layer 21. Metal contact layer 56 may be made of aluminum, silver, Mg/Al and the like. In addition to serving as a reflector, metal contact layer 56 is used as an interconnect. One distinct advantage to using metal contact layer 56 as an interconnect is that it is positioned beneath devices 24', 27' and 28' and is thus hidden from the viewer. The resulting display therefore has none of the dark lines between adjoining pixels as are frequently found in conventional display devices.

Each inverted mesa further includes transparent contact area 52 with a thin (about 50–200 Å) low work function metal layer 52A and a thicker (about 500–4000 Å) ITO coating 52B. In comparison to the first embodiment, the polarities of batteries 30, 31, and 32 are reversed. As a result, the current flowing through devices 24', 27' and 28' is in the opposite direction relative to the embodiment of FIG. 2A, when forward biased for emitting light.

The embodiment shown in FIG. 2B is generally capable of higher resolutions than the embodiment shown in FIG. 2A. This is because the embodiment shown in FIG. 2A can result in a relatively broad light beam emitting from each of devices 24, 27 and 28 due to the relatively large distance between the light emitting regions and the substrate surface. In comparison, the light beams emitting from each of the inverted mesa structures of FIG. 2B do not pass through collimating dielectric layers or substrate material. The result is that relatively narrow light beams emit from inverted mesa devices 24', 27' and 28' of FIG. 2B when compared to those light beams emitted from each of the mesa devices shown in FIG. 2A.

Figure 2C:
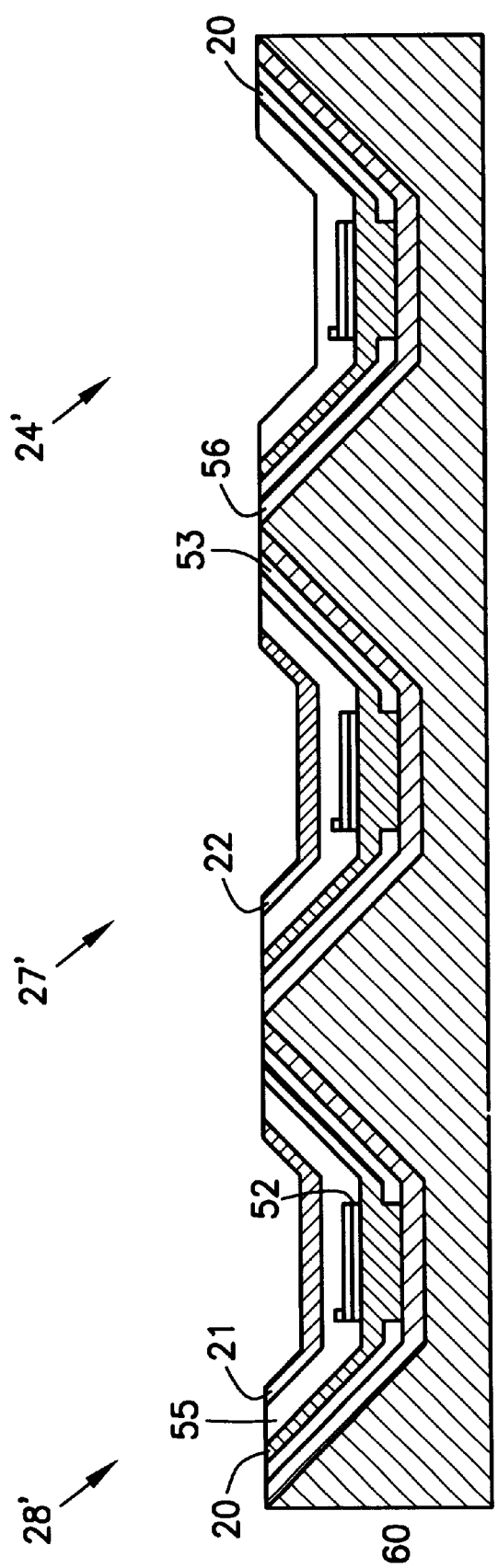

In addition to the configuration shown in FIG. 2B in which inverted mesas are formed by virtue of etched dielectric layer to form regions 50, inverted mesas can be fabricated by forming devices 24', 27' and 28' on a patterned substrate 60 as shown in FIG. 2C. Patterned substrate 60 has pits therein, each pit having a substantially flat bottom surface and slanted side walls. Each side wall is slanted so as to create an obtuse angle with the bottom surface, although 135°–145° is preferred. The depth of the pit can be relatively shallow, on the order of 1000–3000 Å, and as wide as desired. For example, patterned substrate 60 can be made of Si having the pits therein formed by a standard directional etching process. In addition to the pit structure shown in FIGS. 2B and 2C, which has straight, slanted side walls, other cross-sections are also possible. For example, pits having a semicircular cross-section are contemplated. Additionally, the mesas or inverted mesas of any embodiment of the present invention can be arranged, from a top view, in virtually any shape such as squares, triangles, circles, and hexagons.

In any of the embodiments as shown in FIGS. 2A, 2B or 2C, there are no materials with smaller refractive indexes relative to and between the emitting layer of the OLED and the phosphor layers, such that all photons emitted by the OLED are absorbed by the phosphor. This results in an increase in the efficiency of blue radiation transport into the red and green phosphors.

When used in multicolor applications, each pixel used in the displays of the present invention can emit red, green, and blue light, respectively, either simultaneously or separately. Alternatively, when used in monochrome applications, each pixel emits a single color. In either case, the emitted light is from substantially the entire width of the mesa(s) used in the pixels. In multicolor applications, the addition or subtraction of colors is integrated by the eye causing different colors and hues to be perceived. This is well-known in the field of color vision and display colorimetry. In any of the configurations shown in FIGS. 2A, 2B and 2C, the red, green and blue beams of light are substantially coincident. Depending on the size of the display and its intended viewing distance, any combination of the primary colors can be produced from the stack. However, it will appear as one color originating from a single pixel.

Figure 4A:
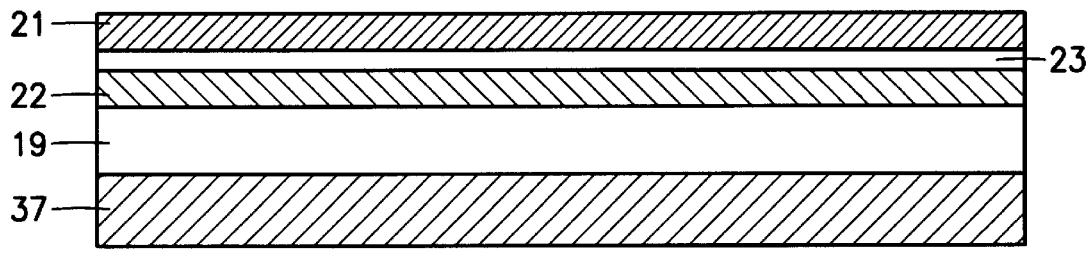
FIGS. 4A to 4D illustrate the method of making a first embodiment of the present invention as shown in FIG. 2A.
Figure 4B:
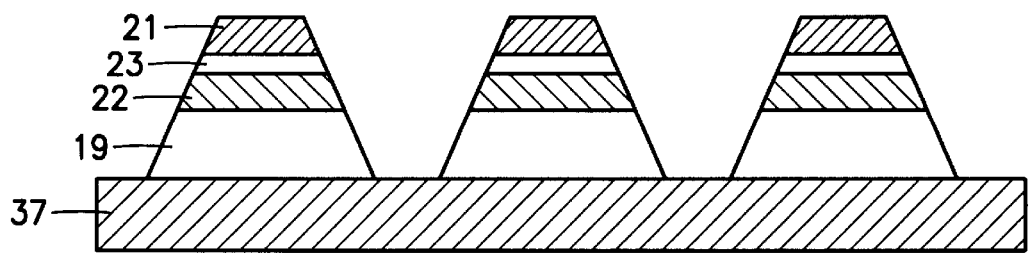
Figure 4C:
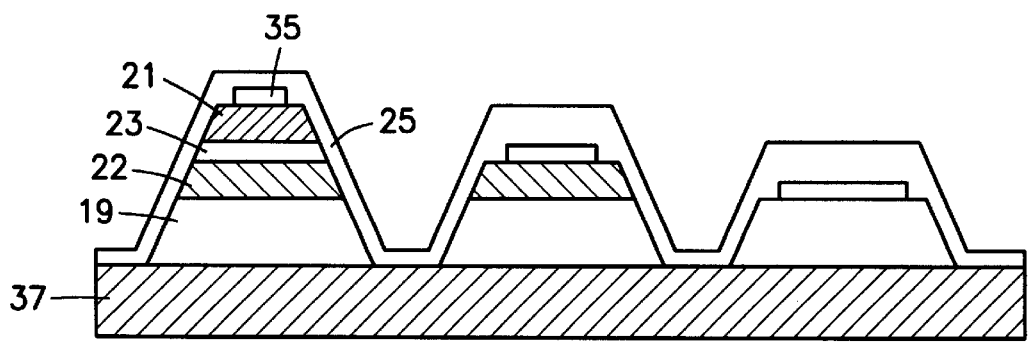
Figure 4D:
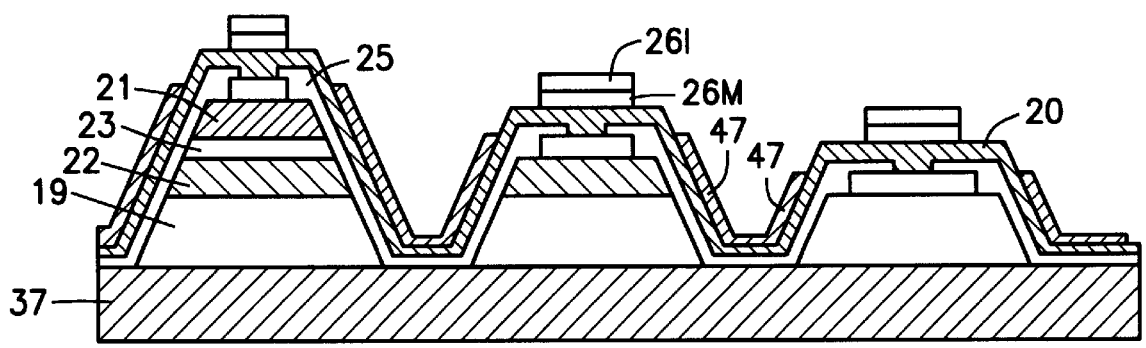

A method for making multicolor LED's on a common substrate 37 will now be described, for the embodiment of the invention shown in FIG. 2A. This method is schematically illustrated in FIGS. 4A–4D, which are not intended to be drawn to scale. The following steps can be used to obtain the multicolor organic device array:

1) Depositing a transparent 5–10 μm dielectric layer 19 onto substrate 37. Dielectric layer 19 should preferably have a refractive index less than or equal to that of substrate 37. Layer 19 can be $SiO_x$ or Teflon, for example.
2) Depositing a green phosphor layer 22.
3) Depositing a thin, etch-stop, dielectric layer 23, such as $SiO_x$.
4) Depositing a red phosphor layer 21. The device after this step appears as is shown in FIG. 4A.
5) Photolithographic patterning via reactive ion or wet chemical etching to create a two dimensional mesa-structure as shown in FIG. 4B.
6) Patterning and etching via appropriate chemical or reactive ion etch to remove said red phosphor 21 from one third of the mesas.
7) Patterning and etching via appropriate chemical or reactive ion etch to remove said green phosphor 22 from the second third of the mesas.
8) Depositing a transparent, conductive material such as ITO to make square contacts 35 on the top of said mesas.
9) Depositing metals (not shown) and patterning of stripe contacts to ITO to form stripe-contact metal columns. Such patterning can be done by shadow masking, lift-off or chloride reactive-ion etching of, for example, Al.
10) Depositing an isolation dielectric 25, such as $SiN_x$. The device after this step appears as is shown in FIG. 4C.
11) Etching windows in the isolation dielectric via reactive ion or wet etching to obtain contact for blue EL 20.
12) Depositing a blue OLED layer 20 over everything. Layer 20 can be of either SH or DH structure, as previously described.
13) Depositing metallization 26M and 26I over everything and patterning of row-metals stripe contacts and metal reflectors 47 on the sides of the mesas, as shown in FIG. 4D.

Although the above-listed method can be used to make the embodiment shown in FIG. 2A, other alternative steps are possible. For example, instead of depositing and etching layer 19 to form the mesa base for each of devices 24, 27 and 28, it is possible to directly etch substrate 37 for this same purpose, thus eliminating the need for layer 19. As another example, the phosphor and OLED layers can be deposited by aligned shadow masks onto pre-etched layer 19 or a pre-etched substrate 37.

Figure 5A:
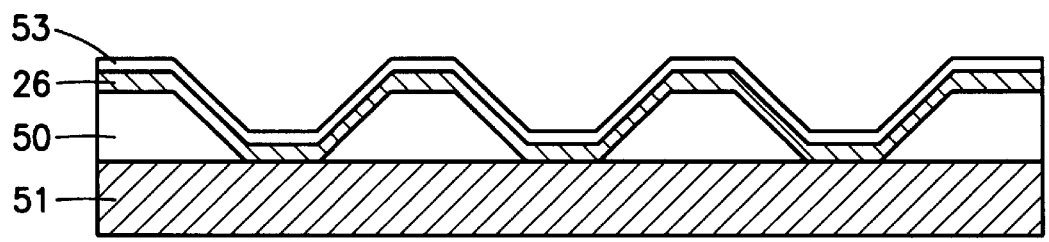
FIGS. 5A to 5E illustrate the method of making a second embodiment of the present invention as shown in FIG. 2B.
Figure 5B:
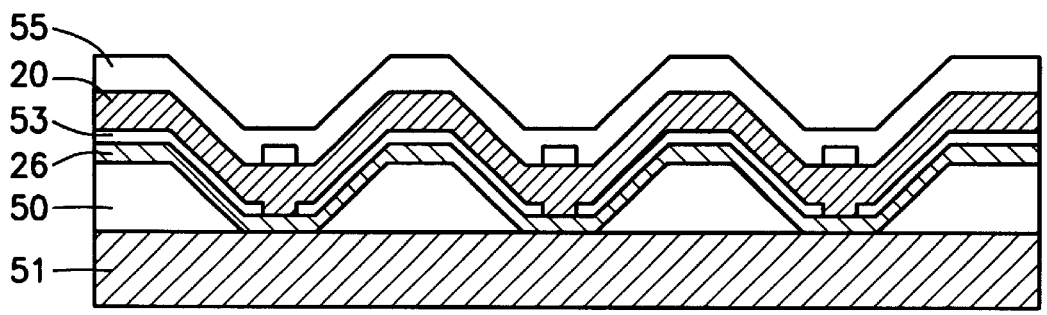
Figure 5C:
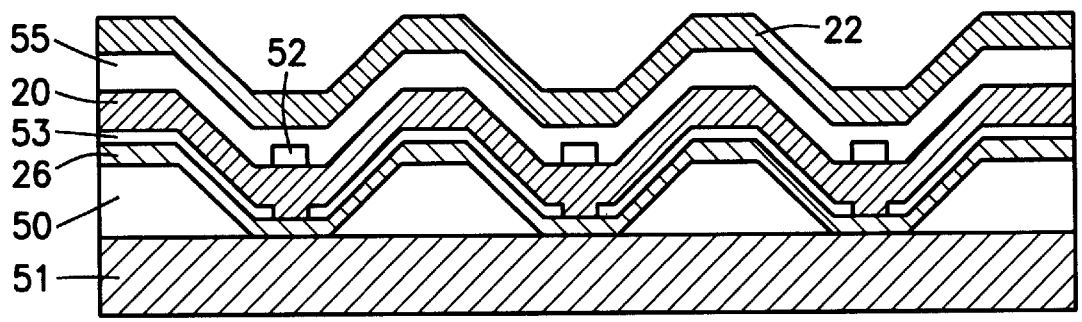
Figure 5D:
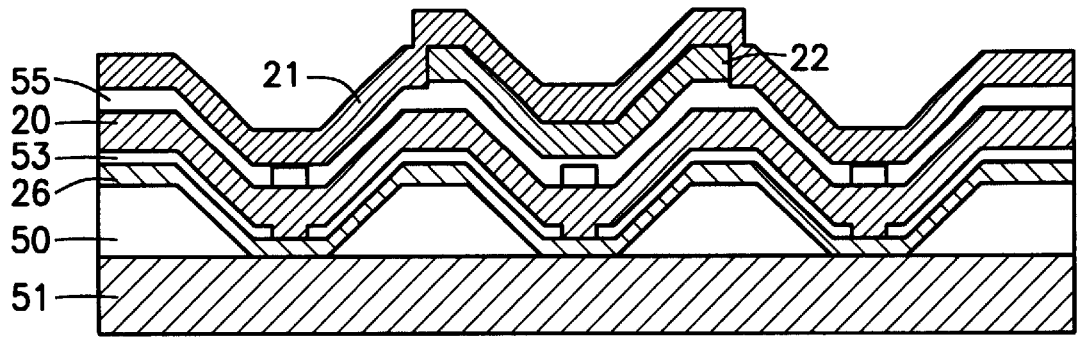
Figure 5E:
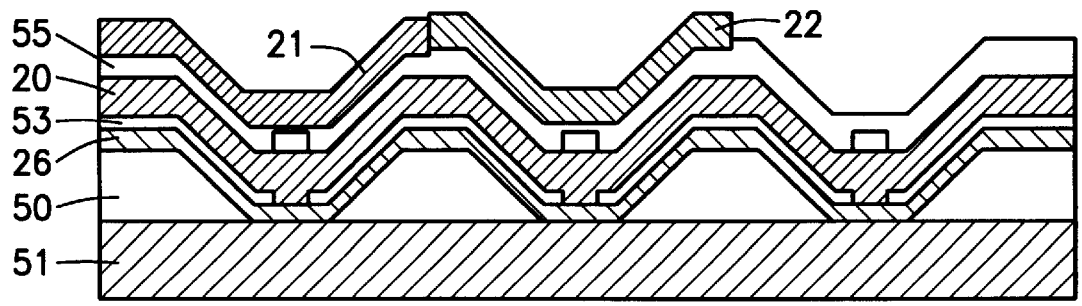

A method for making inverted multicolor LED's on a common substrate 51 will now be described, for the embodiment of the invention shown in FIG. 2B. This same method can be used to form the embodiment shown in FIG. 2C, with the exception that a patterned substrate 60 is used instead of flat substrate 51 with dielectric regions 50 thereon. This method is schematically illustrated in FIGS. 5A–5E, which are not intended to be drawn to scale. The following steps can be used to arrive at the embodiment shown in FIG. 2B:
1) Depositing a dielectric coating 50 onto substrate 51, which may be a metal foil, plastic layer, or other suitable substrate material. Layer 50 should be amenable to selective etching, and can be $SiO_x$, $SiN_x$, polyimide or Teflon, for example.
2) Etching dielectric coating to leave regions 50 such that flat-bottomed pits are formed therebetween.
3) Depositing metallization 56 over everything and metal patterning to create mesa-reflectors and row-metal stripe contacts.
4) Depositing an isolation layer 53, such as $SiO_2$. After this step, the device appears as shown in FIG. 5A.
5) Opening windows in said isolation coating for blue EL 20 contacts.
6) Depositing a blue OLED layer 20 over everything. Layer 20 can be of either SH or DH structure, as previously described for the embodiment shown in FIG. 2A but inverted in layering.
7) Depositing a transparent ITO-contact 52.
8) Patterning said transparent ITO 52 for fabrication of column strip-contacts.
9) Depositing a layer 55 of dielectric material, such as $SiO_x$. After this step, the device appears as shown in FIG. 5B.
10) Depositing a red phosphor layer 21, resulting in a configuration as shown in FIG. 5C.
11) Patterning and etching to remove said red phosphor 21 from a first two-thirds of the mesas.
12) Depositing a green phosphor layer 22, resulting in a configuration as shown in FIG. 5D.
13) Patterning and etching to remove said green phosphor 22 from a second two-thirds of the mesas, resulting in a configuration as shown in FIG. 5E.

It should be recognized that although FIGS. 2A, 2B and 2C are directed to multicolor displays, the mesa and inverted mesa configurations of these figures can be applied to monochromatic displays in which each pixel includes a single mesa or inverted mesa structure which is only able to emit a single color.

Figure 2D:
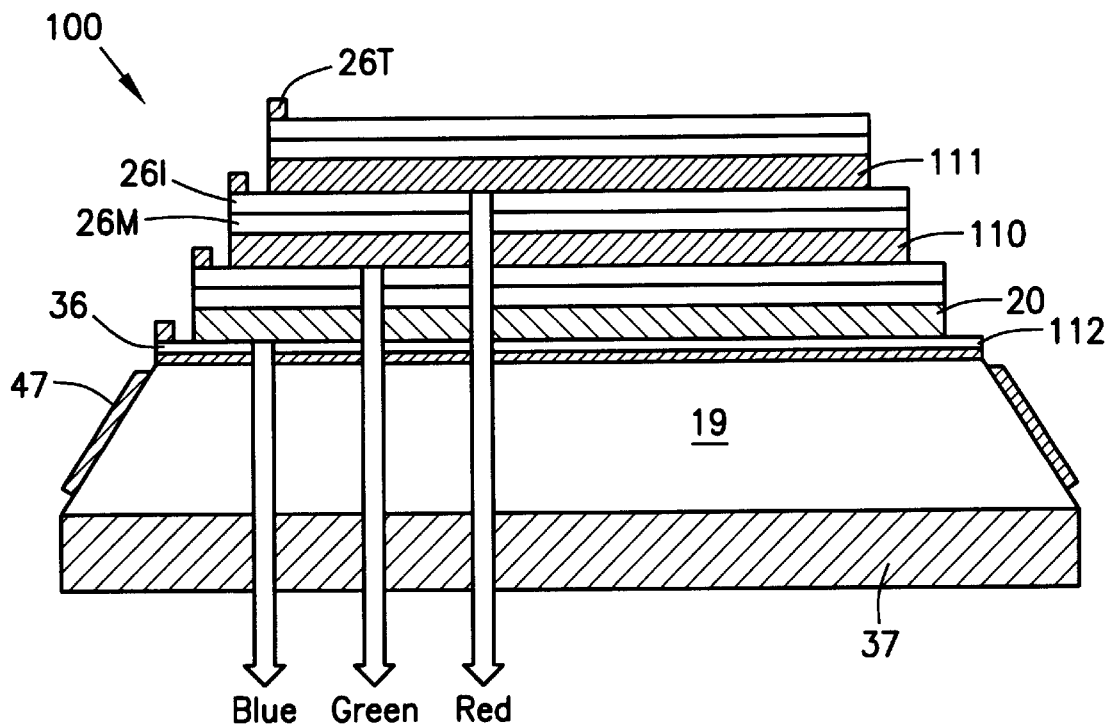
FIG. 2D illustrates a stacked arrangement of blue, green and red OLED's in a mesa pixel configuration according to an embodiment of the present invention.

In a further embodiment of the present invention, blue, green and red OLED are arranged in a stacked configuration 100 as shown in FIG. 2D. Such a stacked arrangement is described in co-pending U.S. application Ser. No. 08/354,674, filed Dec. 13, 1994, and PCT International Application Publication No. WO 96/19792, filed Dec. 6, 1995, the disclosures of which are incorporated herein by reference. The present invention makes use of this stacked arrangement in conjunction with a mesa structure to minimize waveguiding and maximize efficiency as previously discussed. In the embodiment shown in FIG. 2D, blue 20, green 110 and red 111 OLED's are stacked one upon the other, with each OLED separated one from the other by a transparent conductive layer 26 to enable each device to receive a separate bias potential to emit light through the stack. Each OLED 20, 110 and 111 may be of either SH or DH type, as previously described. As shown in FIG. 2D, the stacked arrangement of OLED's 20, 110 and 111 is positioned on conductive layer 112, dielectric layer 19 and transparent substrate 37.

Each conductive layer 26 comprises a low work function (preferably, <4 eV) metal layer 26M, such as Mg, Mg/Ag, and Li/Al, and an additional conductive layer 26I suitable for forming an electrical contact. Of course, all conductive layers between OLED's 20, 110 and 111, and between substrate 37 and OLED 20, must be substantially transparent. Conductive layer 26 on OLED 111, however, being at the top of the stack, need not be transparent and is preferably reflective. Terminal 26T is formed on metal layer 26 for electrical connection thereto, and may be made from In, Pt, Au, Ag, and combinations thereof, or any suitable material as is known in the art.

The stacked configuration 100 may also comprise a layer 36 of low-loss, high refractive index dielectric material, such as $TiO_2$, between conductive layer 112 and dielectric layer 19. Layer 36 is especially preferred when conductive layer 112 is made from ITO, which is a high-loss material such that light from OLED layers 20, 110 and 111 can be easily waveguided in and absorbed by conductive layer 112. Layer 36 substantially eliminates waveguiding and absorption in the ITO, the light emitted from the OLED's 20, 110 and 111 now being substantially transmitted through layer 36. Moreover, layer 36 can have slanted side walls to reflected any waveguided light towards substrate 37.

Figure 6A:
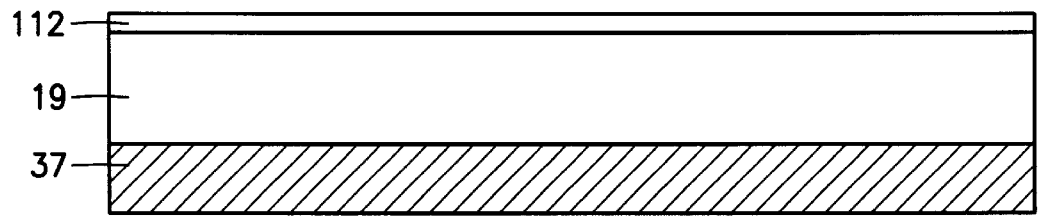
FIGS. 6A to 6D illustrate the method of making a third embodiment of the present invention as shown in FIG. 2D.
Figure 6B:
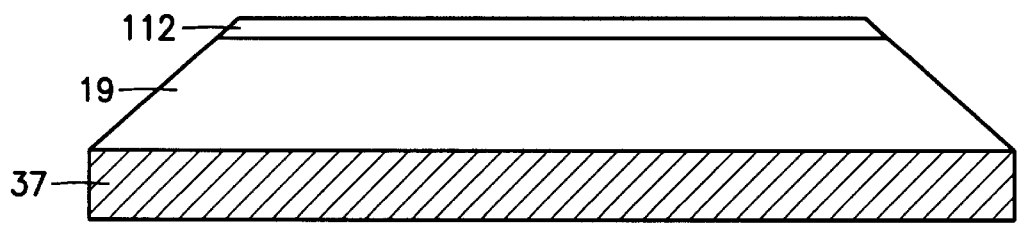
Figure 6C:
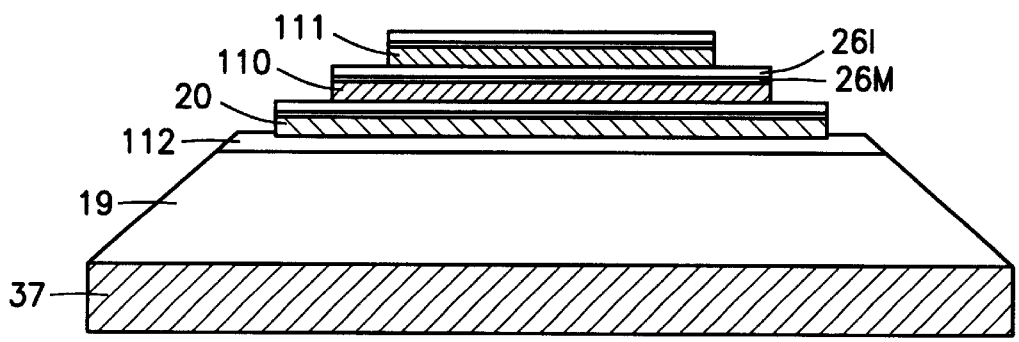
Figure 6D:
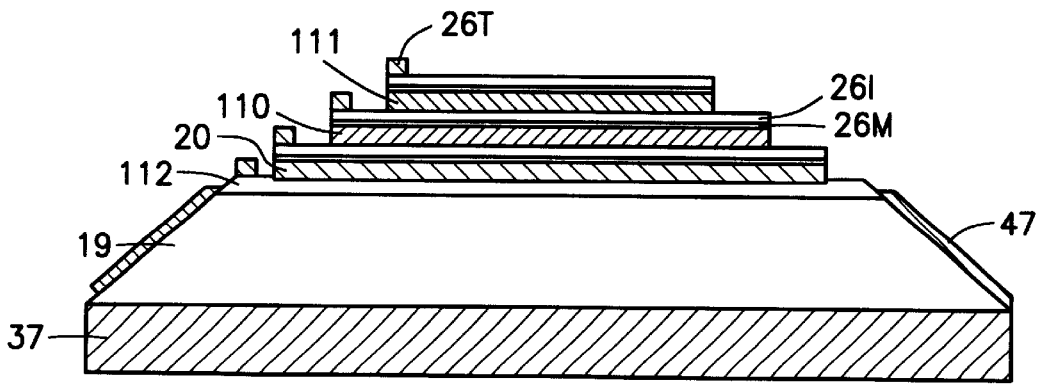

The fabrication of a stacked OLED pixel 100 may be accomplished by either a shadow masking process or a dry etching process, as are known in the art. For example, stacked OLED pixel 100 can be made from the following steps, as schematically shown in FIGS. 6A–6D:
1) Depositing a transparent 5–10 $\mu$m dielectric layer 19 onto transparent substrate 37. Dielectric layer 19 should have a refractive index less than or equal to that of substrate 37. Layer 19 can be $SiO_x$ or Teflon, for example.
2) Depositing a layer of transparent conductive material 112, such as ITO. After this step, the device appears as shown in FIG. 6A.
3) Etching to form a mesa structure, as shown in FIG. 6B.
4) Depositing a blue OLED layer 20. Layer 20 can be of either SH or DH structure, as previously described.
5) Depositing conductive layers 26M and 26I.
6) Depositing a green OLED layer 110. Layer 110 can be of either SH or DH structure, as previously described.
7) Depositing conductive layers 26M and 26I.
8) Depositing a red OLED layer 111. Layer 111 can be of either SH or DH structure, as previously described.
9) Depositing conductive layers 26M and 26I. After this step, the device appears as shown in FIG. 6C.
10) Depositing reflectors 47 on mesa side walls and terminals 26T on each of layers 26I. The final device appears as shown in FIG. 6D.

Although FIG. 2D shows the use of a stacked OLED configuration in conjunction with a mesa structure, the present invention also contemplates the use of a stacked OLED within an inverted mesa structure. Such an inverted mesa structure can be formed by depositing the necessary OLED and conductive layers onto, for example, a substrate having an etched dielectric layer thereon or a substrate having etched pits therein, as previously described for the embodiments shown in FIGS. 2B and 2C, respectively. To accomplish an inverted mesa, stacked OLED device, the layering sequence as described above for the embodiment shown in FIG. 2D would be reversed.

The deposition techniques for any of the above-listed methods are well-known in the art. For example, the preferred method of depositing the OLED layers is by thermal evaporation (or spin coating if a single-layer polymer LED is used); the preferred method of depositing metal layers is by thermal or electron-beam evaporation; the preferred method of depositing ITO is by electron-beam evaporation or sputtering; the preferred method of depositing the phosphor layers is by sputtering; and the preferred method of depositing dielectrics is by plasma-enhanced chemical vapor deposition or electron-beam evaporation.

OLED layers 20, 110 or 111 of any embodiment of the present invention can be made from any suitable light-emissive organic compounds such as, for example, trivalent metal quinolate complexes, Schiff base divalent metal complexes, metal acetylacetonate complexes, metal bidentate ligand complexes, bisphosphonates, metal maleontriledithiolate complexes, molecular charge transfer complexes, aromatic and heterocyclic polymers and rare earth mixed chelates.

The metal bidentate complexes which may be used for layer 20 have the formula $MDL^4_2$ wherein M is selected from trivalent metals of Groups 3–13 of the Periodic Table and Lanthanides. The preferred metal ions are $Al^{+3}$, $Ga^{-3}$, $In^{+3}$ and $Sc^{+3}$. D is a bidentate ligand such as 2-picolylketones, 2-quinaldylkentones and 2-(o-phenoxy) pyridine ketones. The preferred groups for $L^4$ include acetylacetonate, compounds of the formula $OR^3R$ wherein $R^3$ is selected from Si and C, and R is selected from hydrogen, substituted and unsubstituted alkyl, aryl and heterocyclic groups; 3,5-di(t-bu)phenol; 2,6-di(t-bu)phenol; 2,6-di(tbu)cresol; and $H_2Bpz_2$. By way of example, the wavelength resulting from measurement of photoluminescence in the solid state of aluminum (picolymethylketone) bis [2,6-di(tbu)phenoxide] is 420 nm. The cresol derivative of this compound also measured 420 nm. Aluminum (picolylmethylketone)bis (OsiPh$_3$) and scandium (4-methoxy-picolylmethylketone)bis (acetylacetonate) each measured 433 nm, while aluminum [2-(O-phenoxy) pyridine]bis [2,6-di(t-bu) phenoxide] measured 450 nm.

Examples of green OLED emissive materials include tin (iv) metal complexes, such as those having the formula $SnL^1_2L^2_2$ where $L^1$ is selected from salicylaldehydes, salicyclic acid or quinolates (e.g. 8-hydroxyquinoline). $L^2$ can be substituted and unsubstituted alkyl, aryl and heterocyclic groups. When $L^1$ is a quinolate and $L^2$ is a phenyl, for example, the tin (iv) metal complex will have an emission wavelength of 504 nm.

Examples of red OLED emissive materials include divalent metal maleonitriledithiolate ("mnt") complexes, such as those described by C. E. Johnson et al. in "Luminescent Iridium(I), Rhodium(I), and Platinum(II) Dithiolate Complexes," 105 *Journal of the American Chemical Society* 1795 (1983). For example, the mnt [Pt (Pph$_3$)$_2$] has a characteristic wavelength emission of 652 nm.

Additional OLED materials are known in the art (see, e.g., U.S. Pat. No. 5,294,870 to Tang et al., entitled "Organic Electroluminescent Multicolor Image Display Device"; Hosokawa et al., "Highly efficient blue electroluminescence from a distyrylarylene emitting layer with a new dopant," 67 *Applied Physics Letters* 3853–55 (December 1995); Adachi et al., "Blue light-emitting organic electroluminescent devices," 56 *Applied Physics Letters* 799–801 (February 1990); Burrows et al., "Color-Tunable Organic Light Emitting Devices," 69 *Applied Physics Letters* 2959–61 (November 1996)). The entire disclosures of these references are hereby incorporated by reference. Distyrylarylene derivatives such as those described in Hosokawa et al. are a preferred class of compounds. Other preferred OLED's are described in the copending applications discussed below.

The red and green emitting fluorescent media used in the present invention are well-known in the art. U.S. Pat. Nos. 4,769,292 and 5,294,870, the disclosures of which are hereby incorporated by reference, are illustrative. These fluorescent dyes can be dissolved in matrix polymer such as polymethylmethacrylate and many of the suitable dyes were originally developed for plastic lasers. Examples of red fluorescent dyes are 4-dicyanomethylene-4H-pyrans and 4-dicyanomethylene-4H-thiopyrans. Examples of green fluorescent dyes include the polymethine dyes such as cyanines, merocyanines and tri-, tetra, and polynuclear cyanines and merocyanines, oxonols, hemioxanols, styryls, merostyryls and streptocyanines.

As is well-known in the art, a complete display comprises a plurality of pixels. The pixels are arranged as a XY matrix to cover the entire surface area of a given display. Instead of having fixed bias means as batteries 30, 31 and 32, each of the lines of terminals for the device structures can be brought out at an edge of the display, for example, and coupled to suitable horizontal and vertical scan processors, all under control of a display generator which may be a TV unit. Accordingly, each matrix of LED's has at least two axes (x,y), and each device is at the intersection of at least two of the axes. Also, the x-axis may represent a horizontal axis, and the y-axis a vertical axis. The displays of the present invention may include passive or active matrix driving as is well-known in the art.

The devices of the present invention can be used to provide a low cost, high resolution, high brightness, monochromatic or multicolor, flat panel display of any size. This widens the scope of this invention to include displays as small as a few millimeters to as large as the size of a building. The images created on the display could be text or illustrations in full color, in any resolution depending on the size of the individual LED's. Display devices of the present invention are therefore appropriate for an extremely wide variety of applications including billboards and signs, computer monitors, telecommunications devices such as telephones, televisions, large area wall screens, theater screens and stadium screens. Embodiments of the present invention in which the emitted light is directed in a direction away from the substrate are particularly useful for xerographic applications, as such embodiments allow for close positioning to print paper without the use of lenses.

The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996); "Novel Materials for Multicolor LED's", provisional application Ser. No. 60/072,095 (filed Dec. 23, 1996); "Electron Transporting and Light Emitting Layers Based on Organic Free Radicals", Ser. No. 08/774,120 (filed Dec. 23, 1996); "Multicolor Display Devices", Ser. No. 08/772,333 (filed Dec. 23, 1996); "Red-Emitting Organic Light Emitting Devices (LED's)", Ser. No. 08/774,087 (filed Dec. 23, 1996); "Driving Circuit For Stacked Organic Light Emitting Devices", Ser. No. 08/792,050 (filed the same day as the application herein); "High Efficiency Organic Light Emitting Device Structures", Ser. No. 08/772,332 (filed Dec. 23, 1996); "Vacuum Deposited, Non-Polymeric Flexible Organic Light Emitting Devices", Ser. No. 08/789,319 (filed Jan. 23, 1997); and "Stacked Organic Light Emitting Devices", Ser. No. 08/792,046 (filed the same day as the application herein); each co-pending application being incorporated herein by reference in its entirety. The subject invention may also be used in conjunction with the subject matter of each of co-pending U.S. patent application Ser. Nos. 08/354,674, 08/613,207, 08/632,322 and 08/693,359 and provisional patent application Ser. Nos. 60/010,013, 60/024,001 and 60/025,501, each of which is also incorporated herein by reference in its entirety.

Those with skill in the art may recognize various modifications to the embodiments of the invention described and illustrated herein. Such modifications are meant to be covered by the spirit and scope of the appended claims. For example, multilayer stacks of alternate high and low refractive index layers can be formed in regions of collimating dielectric layer 19 at the interface with the underlying substrate 37 for enhancing the efficiency of layer 19. Such MLS stacks are taught by H. A. MacLeod in his book *Thin Film Optical Filters* 94–110 (1969), incorporated herein by reference.

What is claimed is:

1. A method of fabricating a multicolor display, said method comprising:

depositing a dielectric layer over a transparent substrate;

depositing a green phosphor layer over said dielectric layer;

depositing an etch-stop, dielectric layer over said green phosphor layer;

depositing a red phosphor layer over said etch-stop, dielectric layer;

patterning via angle-dry etch to create a mesa-structure having first, second and third mesas, wherein each mesa has at least two angled side walls;

etching to remove said red phosphor from said first mesa;

etching to remove said green phosphor from said second mesa;

depositing a transparent conductive coating over said two dimensional mesa structure to form contacts on said mesas;

depositing an isolation dielectric over said mesa structure;

etching windows in said isolation dielectric, wherein the placement of said windows corresponds to the position of the transparent conductive depositing a blue OLED structure over said isolation dielectric such that said blue OLED contacts said transparent conductive coating through said windows;

depositing a reflective conductive coating over said blue OLED to form contacts on said blue OLED.

2. The method of claim 1, wherein said blue OLED comprises an emissive layer selected from the group consisting of trivalent metal quinolate complexes, Schiff base divalent metal complexes, metal acetylacetonate complexes, metal bidentate ligand complexes, bisphosphonates, molecular charge transfer complexes, aromatic and heterocyclic polymers and rare earth mixed chelates.

3. The method of claim 1, wherein said green phosphor comprises at least one polymethine fluorescent dye selected from the group consisting of cyanines, merocyanines and tri-, tetra-, and polynuclear cyanines and merocyanines, oxonols, hemioxanols, styryls, merostyryls and streptocyanines.

4. The method of claim 1, wherein the red phosphor comprises at least one fluorescent dye selected from the group consisting of 4-dicyano-methylene-4H-pyrans and 4-dicyanomethylene-4H-thiopyrans.

5. The method of claim 1, wherein said depositing a blue OLED structure comprises:

depositing a hole transporting layer;

depositing an emission layer over said hole transporting layer; and depositing an electron transporting layer over said emission layer.

6. The method of claim 1, wherein said depositing a blue OLED structure comprises:

depositing a hole transporting layer; and depositing a multifunctional layer over said hole transporting layer, said multifunctional layer serving as an emission layer and an electron transporting layer.

7. The method of claim 1, wherein said transparent conductive coating comprises indium-tin-oxide.

8. The method of claim 1, wherein said reflective conductive coating comprises a metal having a work function of less than about four electron volts.

9. A method of fabricating a multicolor display, said method comprising:

depositing a dielectric layer over a substrate;

etching three flat-bottomed pits into said dielectric layer to form at least three reverse mesas, wherein each of the three reverse mesas has at least two angled side walls;

depositing a metal layer over said three reverse mesas;

depositing an isolation dielectric layer over said metal layer;

etching windows in said isolation dielectric layer;

depositing a blue OLED structure over said isolation dielectric such that said blue OLED contacts said metal layer through said windows;

depositing a transparent conductive coating over said blue OLED to form contacts on said blue OLED, the position of said contacts corresponding to the position of said windows;

depositing a second isolation dielectric layer over said contacts;

depositing a red phosphor layer over said second isolation dielectric layer;

etching to remove said red phosphor from a first two of said three reverse mesas;

depositing a green phosphor layer over said second isolation dielectric layer; and etching to remove said green phosphor from a second two of said three reverse mesas.

10. The method of claim 9, wherein said blue OLED comprises an emissive layer selected from the group consisting of trivalent metal quinolate complexes, Schiff base divalent metal complexes, metal acetylacetonate complexes, metal bidentate ligand complexes, bisphosphonates, molecular charge transfer complexes, aromatic and heterocyclic polymers and rare earth mixed chelates.

11. The method of claim 9, wherein said green phosphor comprises at least one polymethine fluorescent dye selected from the group consisting of cyanines, merocyanines and tri-, tetra-, and polynuclear cyanines and merocyanines, oxonols, hemioxanols, styryls, merostyryls and streptocyanines.

12. The method of claim 9, wherein the red phosphor comprises at least one fluorescent dye selected from the group consisting of 4-dicyano-methylene-4H-pyrans and 4-dicyanomethylene-4H-thiopyrans.

13. The method of claim 9, wherein depositing a blue OLED structure comprises:

depositing an electron transporting layer;

depositing an emission layer over said electron transporting layer; and depositing a hole transporting layer over said emission layer.

14. The method of claim 9, wherein said depositing a blue OLED structure comprises:

depositing a multifunctional layer, said multifunctional layer serving as an emission layer and an electron transporting layer; and depositing a hole transporting layer on said multifunctional layer.

15. The method of claim 9, wherein said transparent conductive coating comprises indium-tin-oxide.

16. The method of claim 9, wherein said metal layer comprises a metal having a work function of less than about four electron volts.

17. A method of fabricating a multicolor display, said method comprising:

etching at least three flat-bottomed pits into a substrate to form at least three reverse mesas, wherein each of the three reverse mesas has at least two angled side walls;

depositing a metal layer over said three reverse mesas;

etching windows in said isolation dielectric layer;

depositing a blue OLED structure over said isolation dielectric such that said blue OLED contacts said metal layer through said windows;

depositing a transparent conductive coating over said blue OLED to form contacts on said blue OLED, the position of said contacts corresponding to the position of said windows;

depositing a second isolation dielectric layer over said contacts;

depositing a red phosphor layer over said second isolation dielectric layer;

etching to remove said red phosphor from a first two of said three reverse mesas;

depositing a green phosphor layer over aid second isolation dielectric layer; and etching to remove said green phosphor from a second two of said three reverse mesas.

18. The method of claim 17, wherein said blue OLED comprises an emissive layer selected from the group consisting of trivalent metal quinolate complexes, Schiff base divalent metal complexes, metal acetylacetonate complexes, metal bidentate ligand complexes, bisphosphonates, molecular charge transfer complexes, aromatic and heterocyclic polymers and rare earth mixed chelates.

19. The method of claim 17, wherein said green phosphor comprises at least one polymethine fluorescent dye selected from the group consisting of cyanines, merocyanines and tri-, tetra-, and polynuclear cyanines and merocyanines, oxonols, hemioxanols, styryls, merostyryls and streptocyanines.

20. The method of claim 17, wherein the red phosphor comprises at least one fluorescent dye selected from the group consisting of 4-dicyano-methylene-4H-pyrans and 4-dicyanomethylene-4H-thiopyrans.

21. The method of claim 17, wherein said depositing a blue OLED structure comprises:

depositing an electron transporting layer;

depositing an emission layer on said electron transporting layer; and depositing a hole transporting layer on said emission layer.

22. The method of claim 17, wherein said depositing a blue OLED structure comprises:

depositing a multifunctional layer, said multifunctional layer serving as an emission layer and an electron transporting layer; and depositing a hole transporting layer on said multifunctional layer.

23. The method of claim 17, wherein said transparent conductive coating comprises indium-tin-oxide.

24. The method of claim 17, wherein said metal layer comprises a metal having a work function of less than about four electron volts.

25. The method of claim 1, wherein said mesa-structure is two dimensional.

26. The method of claim 1, wherein each of the mesas has a top portion and a bottom portion, the top portion being narrow relative to the bottom potion to guide light in a direction from the top portion to the bottom portion.

27. The method of claim 1, wherein the two side walls are configured at a predetermined acute angle to minimize waveguiding.

28. The method of claim 27, wherein the two side walls are configured at an acute angle ranging between 35° and 45° relative to the transparent substrate.

29. The method of claim 1, wherein each of the first, second, and third mesas is separated from the others to prevent color cross-talk.

30. The method of claim 9, wherein the two side walls are configured at a predetermined acute angle to minimize waveguiding.

31. The method of claim 30, wherein the two side walls are configured at an acute angle ranging between 35° and 45° relative to the transparent substrate.

32. The method of claim 17, wherein the two side walls are configured at a predetermined acute angle to minimize waveguiding.

33. The method of claim 32, wherein the two side walls are configured at an acute angle ranging between 35° and 45° relative to the transparent substrate.

* * * * *